(12) United States Patent
Lin et al.

(10) Patent No.: US 11,527,688 B2
(45) Date of Patent: Dec. 13, 2022

(54) ELECTRONIC DEVICE

(71) Applicant: InnoLux Corporation, Miao-Li County (TW)

(72) Inventors: Ming-Chang Lin, Miao-Li County (TW); Tzu-Min Yan, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 16/860,040

(22) Filed: Apr. 27, 2020

(65) Prior Publication Data
US 2020/0357971 A1    Nov. 12, 2020

(30) Foreign Application Priority Data

May 9, 2019 (CN) .......................... 201910386281.1

(51) Int. Cl.
*H01L 33/00* (2010.01)
*H01L 33/62* (2010.01)
*H01L 23/00* (2006.01)
*H01L 25/16* (2006.01)

(52) U.S. Cl.
CPC .............. *H01L 33/62* (2013.01); *H01L 24/13* (2013.01); *H01L 24/16* (2013.01); *H01L 24/81* (2013.01); *H01L 25/167* (2013.01); *H01L 2224/13109* (2013.01); *H01L 2224/13111* (2013.01); *H01L 2224/13113* (2013.01); *H01L 2224/13144* (2013.01); *H01L 2924/014* (2013.01); *H01L 2924/12041* (2013.01); *H01L 2924/13069* (2013.01); *H01L 2933/0066* (2013.01)

(58) Field of Classification Search
CPC ......... H01L 2924/013; H01L 2924/014; H01L 2224/13111; H01L 2224/29311; H01L 2924/01049; H01L 2924/01083
See application file for complete search history.

(56) References Cited

U.S. PATENT DOCUMENTS

| 6,514,782 B1 * | 2/2003 | Wierer, Jr. ............ H01L 33/405 438/22 |
| 2008/0246051 A1 * | 10/2008 | Hosokawa ............ H01S 5/0237 257/E33.057 |
| 2013/0037603 A1 | 2/2013 | Choi |
| 2013/0056776 A1 * | 3/2013 | Su ........................... H01L 33/60 257/E33.072 |
| 2013/0214310 A1 * | 8/2013 | Wang ................... H05K 3/3431 438/27 |

(Continued)

FOREIGN PATENT DOCUMENTS

| CN | 105308765 A | 2/2016 |
| CN | 107924828 A | 4/2018 |

(Continued)

*Primary Examiner* — Bradley Smith
*Assistant Examiner* — David J Goodwin
(74) *Attorney, Agent, or Firm* — Winston Hsu

(57) ABSTRACT

An electronic device is provided in the present disclosure. The electronic device includes a substrate and a light emitting diode. The light emitting diode is bonded to the substrate through a solder alloy. The solder alloy includes tin and a metal element M, and the metal element M is one of the indium and bismuth. The atomic percentage of tin in the sum of tin and the metal element M ranges from 60% to 90% in the solder alloy.

7 Claims, 5 Drawing Sheets

(56) References Cited

U.S. PATENT DOCUMENTS

| | | | |
|---|---|---|---|
| 2015/0380621 A1 | 12/2015 | Chae | |
| 2016/0131329 A1* | 5/2016 | Park | G02B 3/0037 |
| | | | 362/235 |
| 2017/0170373 A1* | 6/2017 | Peng | H01L 27/124 |
| 2017/0338390 A1* | 11/2017 | Yoon | H01L 33/36 |
| 2019/0067176 A1* | 2/2019 | Mirpuri | B23K 35/22 |
| 2019/0214525 A1 | 7/2019 | Behr | |
| 2020/0220056 A1 | 7/2020 | Otto | |
| 2020/0313049 A1* | 10/2020 | Huang | H01L 33/60 |

FOREIGN PATENT DOCUMENTS

| | | |
|---|---|---|
| DE | 11 2014 002 241 T5 | 1/2016 |
| DE | 10 2015 114 088 A1 | 3/2017 |
| DE | 10 2017 107 201 A1 | 10/2018 |
| EP | 1 531 492 A2 | 5/2005 |
| EP | 1 531 492 A3 | 7/2018 |

* cited by examiner

ELECTRONIC DEVICE

BACKGROUND OF THE DISCLOSURE

1. Field of the Disclosure

The present disclosure relates to an electronic device, more particularly to an electronic device in which the electronic component is bonded through the solder.

2. Description of the Prior Art

The melting temperature or characteristics (including hardness) of the solder used in the bonding process of the electronic device may affect the yields of the device. Thus, improving the yields or reliability of the bonding process of the electronic device has become an important issue in this field.

SUMMARY OF THE DISCLOSURE

An electronic device is provided in the present disclosure. The electronic device includes a substrate and a light emitting diode. The light emitting diode is bonded to the substrate through a solder alloy. The solder alloy includes tin and a metal element M, and the metal element M is one of the indium and bismuth. The atomic percentage of tin in the sum of tin and the metal element M ranges from 60% to 90% in the solder alloy.

A method of manufacturing an electronic device is provided in the present disclosure. The method of manufacturing an electronic device includes the following steps: providing a substrate, forming a solder on the substrate, and bonding a light emitting diode to the substrate through the solder. The solder is formed by stacking a plurality of first conductive layers and a plurality of second conductive layers alternatively, and the plurality of first conductive layers and the plurality of second conductive layers include different materials.

A method of manufacturing an electronic device is provided in the present disclosure. The method of manufacturing an electronic device includes the following steps: providing a light emitting diode, forming a solder on the light emitting diode, and bonding the light emitting diode to a substrate through the solder. The solder is formed by stacking a plurality of first conductive layers and a plurality of second conductive layers alternatively, and the plurality of first conductive layers and the plurality of second conductive layers include different materials.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. It is noted that, for purposes of illustrative clarity and being easily understood by the readers, various drawings of this disclosure show a portion of the electronic device, and certain elements in various drawings may not be drawn to scale. In addition, the number and dimension of each element shown in drawings are for illustrative and are not intended to limit the scope of the present disclosure.

Certain terms are used throughout the description and following claims to refer to particular elements. As one skilled in the art will understand, electronic equipment manufacturers may refer to an element by different names. This document does not intend to distinguish between elements that differ in name but not function. In the following description and in the claims, the terms "include", "comprise" and "have" are used in an open-ended fashion, and thus should be interpreted to mean "include, but not limited to . . . ".

It will be understood that when an element or layer is referred to as being "on" or "connected to" another element or layer, it may be directly on or directly connected to the other element or layer, or intervening elements or layers may be presented (indirectly). In contrast, when an element is referred to as being "directly on" or "directly connected to" another element or layer, there are no intervening elements or layers presented.

Although terms such as first, second, third, etc., may be used to describe diverse constituent elements, such constituent elements are not limited by the terms. The terms are used to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

It should be noted that the technical features in different embodiments described in the following can be replaced, recombined, or mixed with one another to constitute another embodiment without departing from the spirit of the present disclosure.

The electronic device may include a substrate and electronic components disposed on the substrate. According to some embodiments, the electronic components may include light emitting elements, antenna, sensor, display element or other suitable electronic components, but not limited thereto.

Figure 1:
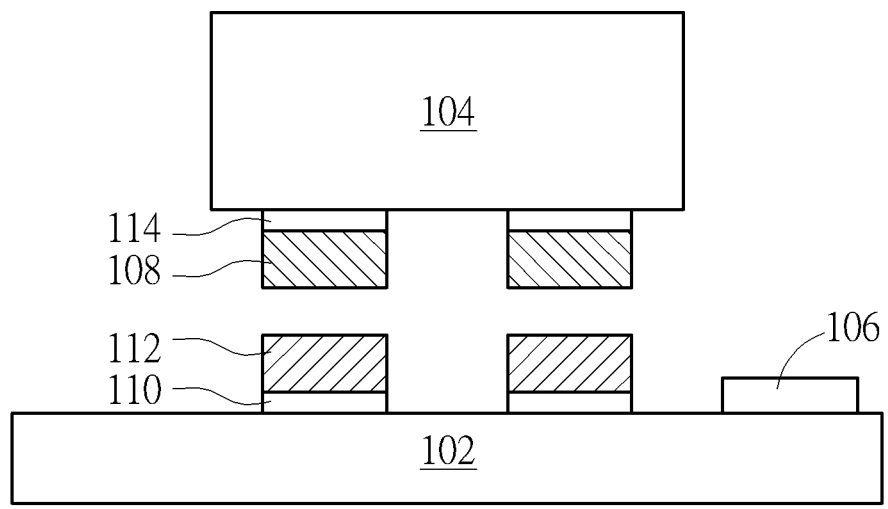
FIG. 1 schematically illustrates a side view of the electronic device before bonding according to the first embodiment of the present disclosure.
Figure 2:
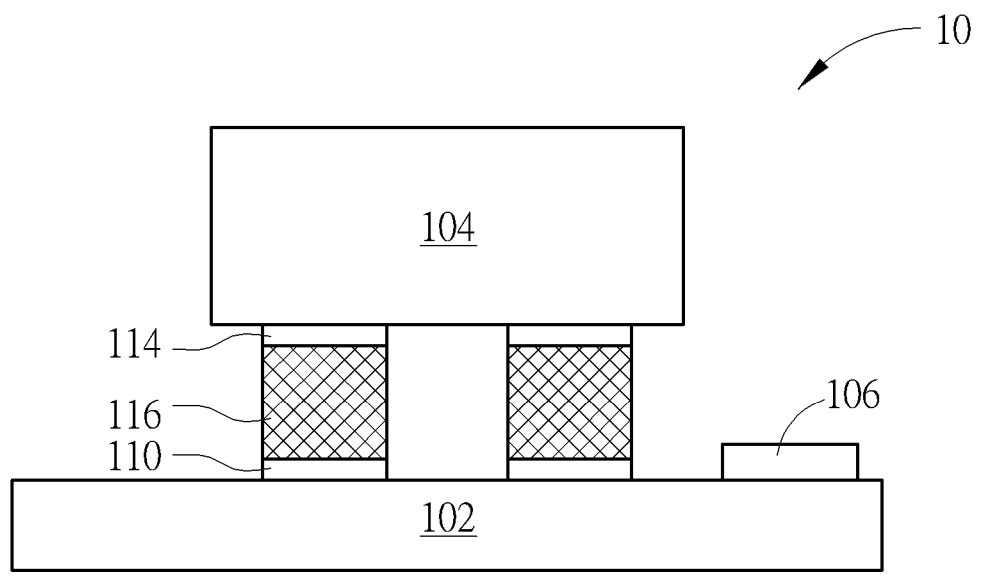
FIG. 2 schematically illustrates a side view of the electronic device after bonding according to the first embodiment of the present disclosure.

Referring to FIG. 1 and FIG. 2, FIG. 1 schematically illustrates a side view of the electronic device before bonding according to the first embodiment of the present disclosure, and FIG. 2 schematically illustrates a side view of the electronic device after bonding according to the first embodiment of the present disclosure. As shown in FIG. 1, a substrate 102 and/or a light emitting diode (LED) 104 are provided, and a solder 112 is disposed on or form on the substrate 102 and/or a light emitting diode (LED) 104, and the light emitting diode may include quantum dot light emitting diode (QD-LED), micro light emitting diode (micro LED) or other suitable light emitting diodes, but not limited thereto. In some embodiments, a light converting material may be disposed on the light emitting diode, and the light converting material may include quantum dot (QD) material, fluorescence material, color filter (CF) material, phosphor material, other suitable light converting materials or the combinations of the above-mentioned materials, but not limited thereto. In some embodiments, the light converting material may cover the light emitting diode or be disposed corresponding to the light emitting diode. In some embodiments, the substrate 102 may include rigid substrate, flexible substrate or the combinations of the above-mentioned substrate, but not limited thereto. In some embodiments, the substrate 102 may include foldable substrate or deformable substrate such as plastic substrate, but not limited thereto. In some embodiments, the material of the substrate 102 may include glass, quartz, organic polymer, metal, ceramic, other suitable materials or the combinations of the above-mentioned materials, but not limited thereto. If the material of the substrate 102 includes organic polymer, the organic polymer may include polyimide (PI), polyethylene terephthalate (PET), polycarbonate (PC) or the combinations of the above-mentioned materials, but not limited thereto.

In some embodiments (as shown in FIG. 1), at least one switch element 106 may be disposed on the substrate 102, and the light emitting diode 104 may be electrically connected to the switch element 106, but not limited thereto. In some embodiments, the substrate 102 is a thin film transistor substrate, the switch element 106 includes thin film transistor or other suitable components. In some embodiments (not shown), the switch element 106 and the light emitting diode 104 may be disposed on different surfaces of the substrate 102 (such as opposite side surfaces), and the light emitting diode 104 may be electrically connected to the switch element 106. In some embodiments, other kinds of the electronic components (such as integrated circuit (IC), circuit, conductive pad or wire) may be disposed on the substrate 102, but not limited thereto. In order to simplify or clarify the figures, some of the electronic components mentioned above or the protecting layer is omitted.

In some embodiments, the electronic device may be an active matrix light emitting diode (AM-LED) or passive matrix light emitting diode (PM-LED). In some embodiments, a solder 112 may be disposed on or formed on the substrate 102, and the light emitting diode 104 bonded to the substrate 102 through the solder 112. The solder 112 may include metal, alloy, conductive materials or the combinations of the above-mentioned materials, but not limited thereto. For example, the solder 112 may include tin (Sn), indium (In), bismuth (Bi) or other suitable materials such as the alloy of tin and indium or the alloy of tin and bismuth, but not limited thereto. If the material of the solder only includes tin, higher temperature is needed during bonding process because the melting point of tin is higher (about 231.9° C.), the electronic component may be easily damaged or the reliability of the electronic component may be reduced. If the material of the solder only includes indium, although the melting point of indium is lower (about 157° C.), the scratches may be easily produced because the hardness of indium is lower, abnormal situations may be occurred or the impedance may be increased during bonding process.

In some embodiments of the present disclosure, the solder 112 may include tin and indium, such as the alloy or compound of tin and indium, but not limited thereto. In some embodiments, the solder 112 may include tin and metal element M, the metal element M is one of the indium and bismuth, and the atomic percentage of tin in the solder 112 ranges from 40% to 85%, which can reduce the melting point (about 120° C. to 200° C.) and increase the hardness of the solder 112, the possibility of damage or scratch of the electronic component may be reduced. For example, the atomic percentage of tin may be the atomic percentage of tin in the sum of tin and indium (Sn/(Sn+In)) when the metal element M in the solder 112 is indium, and the atomic percentage of tin may be designed to range from 40% to 85%.

In another embodiment, the atomic percentage of tin may be the atomic percentage of tin in the sum of tin and bismuth (Sn/(Sn+Bi)) when the metal element M in the solder 112 is bismuth, and the atomic percentage of tin may be designed to range from 40% to 85%. In another embodiment, the atomic percentage of tin may be regarded as (Sn/(Sn+Bi)) or (Sn/(Sn+In)) when the solder 112 includes bismuth and indium, and the atomic percentage of tin may be in a range from 40% to 85%. In some embodiments, the atomic percentage of tin in the solder 112 may be in a range from 60% to 85%, that is, 60%≤(Sn/(Sn+In))≤85% or 60%≤(Sn/(Sn+Bi))≤85%. In some embodiments, the atomic percentage of tin in the solder 112 may be in a range from 60% to 70%, that is, 60%≤(Sn/(Sn+In))≤70% or 60%≤(Sn/(Sn+Bi))≤70%. In some embodiments, the atomic percentage of tin in the solder 112 may be in a range from 70% to 80%, that is, 70%≤(Sn/(Sn+In))≤80% or 70%≤(Sn/(Sn+Bi))≤80%.

In some embodiments, a bonding layer 110 may be disposed between the substrate 102 and the solder 112. For example, the bonding layer 110 may be an under bump metallurgy (UBM), but not limited thereto. In some embodiments, the bonding layer 110 may be used to reduce diffusion of the material of the solder 112 to the substrate 102, the bonding layer 110 may be served as a barrier layer. In addition, the bonding layer 110 may be used to increase the bonding strength or bonding adhesion between the substrate 102 and the solder 112, that is, the bonding layer 110 may be served as an adhesion layer. Moreover, the bonding layer 110 may be used to reduce the impendence between the components or layers, such as the impendence between the conductive pad and the solder 112 on the substrate 102, and the uniformity of current transfer may be improved, but not limited thereto. The material of the bonding layer 110 may include titanium (Ti), platinum (Pt), nickel (Ni), tungsten (W), palladium (Pd), chromium (Cr), gold (Au), silver (Ag), copper (Cu), aluminum (Al), molybdenum (Mo), oxides of the above-mentioned metals, transparent conductive oxides (such as indium tin oxide (ITO) or indium zinc oxide (IZO)) or the combinations of the above-mentioned materials, but not limited thereto. In some embodiments, the bonding layer 110 between the substrate 102 and the solder 112 may be removed according to the demands.

In some embodiments (as shown in FIG. 1), a conductive structure 108 may be disposed on the light emitting diode 104. In some embodiments, the material of the conductive structure 108 may include gold, other suitable metals or the combinations of the above-mentioned materials, but not limited thereto. When the material of the conductive structure 108 includes gold, for example, the conductive structure 108 is a gold layer, bonding conditions may be enhanced because of the good corrosion resistance and a higher hardness of gold. In some embodiments, a bonding layer 114 may be disposed between the light emitting diode 104 and the conductive structure 108. The material and/or function of the bonding layer 114 may be the same or similar to the bonding layer 110 mentioned above, but not limited thereto. In some embodiments, the bonding layer 114 between the light emitting diode 104 and the conductive structure 108 may be removed according to the demands.

In some embodiments (not shown), the positions of the conductive structure 108 and the solder 112 shown in FIG. 1 may be exchanged, that is, the conductive structure 108 may be disposed or formed on the substrate 102, and the solder 112 may be disposed or formed on the light emitting diode 104. In details, the bonding layer 110 and the conductive structure 108 may be disposed on the substrate 102 in sequence, the bonding layer 114 and the conductive structure 108 may be disposed on the light emitting diode 104 in sequence, and the light emitting diode 104 may be bonded to the substrate 102 through the solder 112, but not limited thereto. Other suitable layers may be disposed between the above-mentioned components or layers according to the demands. In some embodiments, the bonding layer may be removed according to the demands.

As shown in FIG. 2, the conductive structure 108 and the solder 112 may be mixed to form a solder alloy 116 after the bonding process in some embodiments, and the solder alloy 116 may be an intermetallic compound (IMC), but not limited thereto. In some embodiments, the solder alloy 116 may be located between the bonding layer 114 and the bonding layer 110, the bonding layer 110 is disposed between the solder alloy 116 and the substrate 102 and/or the bonding layer 116 is disposed between the solder alloy 116 and the light emitting diode 104, but not limited thereto. In some embodiments (not shown), when the bonding layer 114 and the bonding layer 110 are not included in the device, the solder alloy 116 may be located between the substrate 102 and the light emitting diode 104. In details, the material of the solder alloy 116 may include the elements of the conductive structure 108 and the solder 112. In some embodiments, the solder alloy 116 may include gold, tin, and a metal element M, and the metal element M may be one of the indium and bismuth, but not limited thereto. In the solder alloy 116, the atomic percentage of tin in the sum of tin and the metal element M is in a range from 60% to 90%. For example, when the metal element M is indium, the atomic percentage of tin in the sum of tin and indium (Sn/(Sn+In)) may be in a range from 60% to 90% or from 60% to 85% in solder alloy 116, that is, 60%≤(Sn/(Sn+In))≤90% or 60%≤(Sn/(Sn+In))≤85%. In some embodiments, when the metal element M is bismuth, the atomic percentage of tin in the sum of tin and bismuth (Sn/(Sn+Bi)) may be in a range from 60% to 90% or from 60% to 80% in the solder alloy 116, that is, 60%≤(Sn/(Sn+Bi))≤90% or 60%≤(Sn/(Sn+Bi))≤80%.

The atomic percentage of the elements included in the solder 112 and/or the solder alloy 116 described in the present disclosure may be obtained by measurement and calculation conducted through energy dispersive spectrometer (EDS), X-ray analyzer or other suitable analyzers.

Other embodiments of the present disclosure will be described in following paragraphs. In order to simplify the descriptions, the label of the same elements would be the same in the following description. In order to compare the differences between embodiments, the differences between different embodiments will be described in detail, and the repeated features will not be redundantly described.

Figure 3:
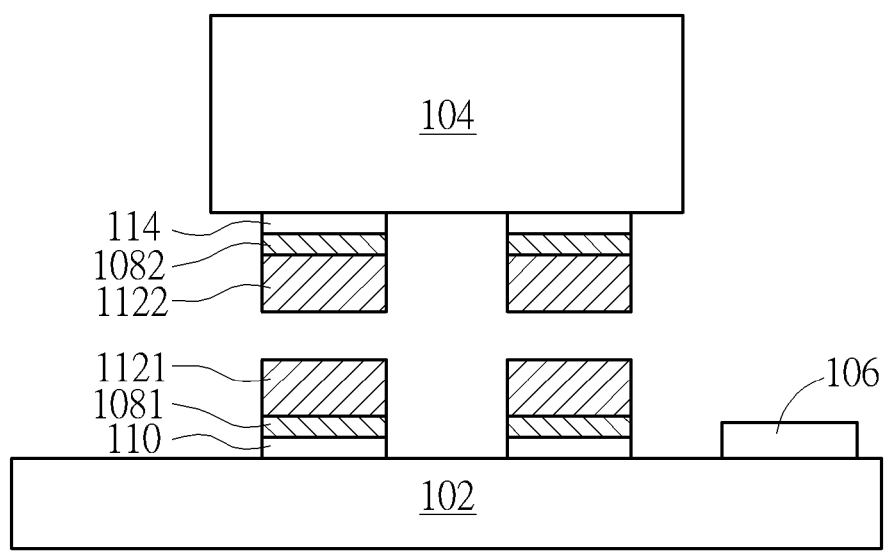
FIG. 3 schematically illustrates a side view of the electronic device before bonding according to the second embodiment of the present disclosure.

Referring to FIG. 3, FIG. 3 schematically illustrates a side view of the electronic device before bonding according to the second embodiment of the present disclosure. Different from the first embodiment (shown in FIG. 1), the bonding layer 114, the conductive structure 1082, and the solder 1122 may be disposed or formed on the light emitting diode 104 in sequence, and the bonding layer 110, the conductive structure 1081, and the solder 1121 may be disposed or formed on the substrate 102 in sequence in some embodiments (as shown in FIG. 3), but not limited thereto. In some embodiments (as shown in FIG. 3), the conductive structure 1082 may be disposed between the solder 1122 and the light emitting diode 104, and the conductive structure 1081 may be disposed between the solder 1121 and the substrate 102, but not limited thereto. In some embodiments, when the conductive structure includes gold and is disposed between the solder and the bonding layer, the conductive structure may be used to increase the adhesion between the solder and the bonding layer. For example, the conductive structure 1081 or the conductive structure 1082 may be respectively used to increase the adhesion between the solder 1121, the solder 1122 and other components (such as the bonding layer 110 and the bonding layer 114), as shown in FIG. 3.

In some embodiments, the positions of the conductive structure 1081 and solder 1121 shown in FIG. 3 may be exchanged. In some embodiments, the positions of the conductive structure 1082 and solder 1122 shown in FIG. 3 may be exchanged. In some embodiments, the bonding layer 114 and/or the bonding layer 110 may be selectively removed. When the conductive structure 1082 is disposed on the surface of the solder 1122 which is away from the light emitting diode 104 and the material of the conductive structure 1082 includes gold, the conductive structure 1082 may protect the solder 1122 or reduce the possibility of oxidation of the solder 1122. When the conductive structure 1081 is disposed on the surface of the solder 1121 which is away from the substrate 102 and the material of the conductive structure 1081 includes gold, the conductive structure 1081 may protect the solder 1121 or reduce the possibility of oxidation of the solder 1121.

In some embodiments (as shown in FIG. 3), the thickness of the conductive structure 1081 (or the conductive structure 1082) may be less than or equal to the thickness of the solder 1121 (or the solder 1122), but not limited thereto. It should be noted that, the thicknesses of the components (or layers) disposed on the substrate 102 mentioned above or in the following description may be defined as the maximum thicknesses of the components (or layers) in a normal direction of the substrate 102. Similarly, the thicknesses of the components (or layers) disposed on the light emitting diode 104 mentioned above or in the following description may be defined as the maximum thicknesses of the components (or layers) in a normal direction of the light emitting diode 104. The thicknesses of the above-mentioned components (or layers) may be measured through the picture of any cross-sectional view of the components or layers taken by the scanning electron microscope (SEM). For example, the layer A (analyte) is disposed between the layer B and the layer C, the picture taken by SEM should display at least a part of the layer A, at least a part of the layer B, and at least a part of the layer C, and the layer A having the entire thickness should be shown in the picture, and the maximum thickness of the layer A measured through the SEM picture may be regarded as the thickness of the layer A, but not limited thereto.

In some embodiments (not shown), the solder 1121 (as shown in FIG. 3) formed in the substrate 102 may be removed, that is, the bonding layer 110 and the conductive structure 1081 are formed or disposed on the substrate 102 in sequence. In some embodiments (not shown), the solder 1122 (as shown in FIG. 3) formed on the light emitting diode 104 may be removed, the bonding layer 114 and the conductive structure 1082 are formed or disposed on the light emitting diode 104 in sequence.

In some embodiments, the bonding layer 110 and/or the bonding layer 114 may be removed according to the demands. In some embodiments, one of the solder 1121 and the conductive structure 1081 may be removed according to the demands. In some embodiments, one of the solder 1122 and the conductive structure 1082 may be removed according to the demands.

Figure 4:
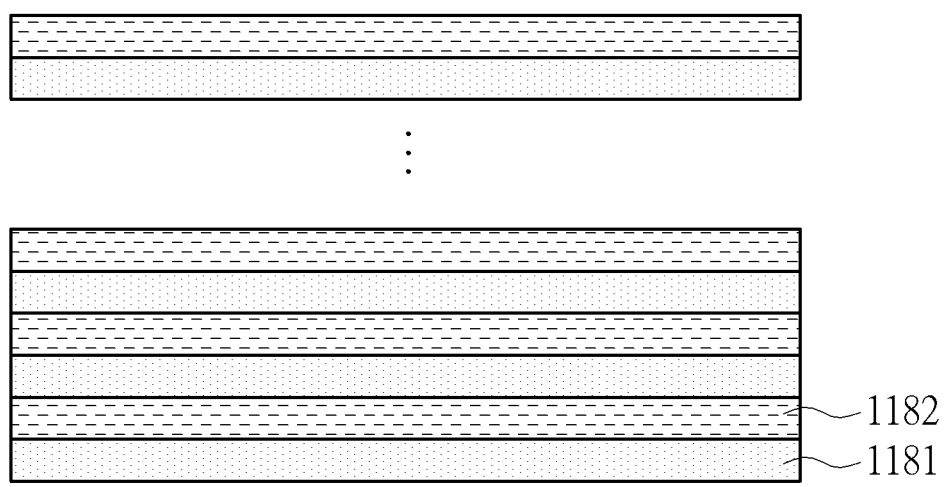
FIG. 4 schematically illustrates the solder before mixing according to the second embodiment of the present disclosure.

Referring to FIG. 4, FIG. 4 schematically illustrates the solder before mixing according to the second embodiment of the present disclosure. Different from the first embodiment, in some embodiments (shown in FIG. 4), the solder 1121 and the solder 1122 may be a stacked layer formed of a plurality of first conductive layers 1181 and a plurality of second conductive layers 1182 which are alternatively stacked. In other word, the solder 1121 or the solder 1122 is formed by stacking a plurality of first conductive layers 1181 and a plurality of second conductive layers 1182 alternatively. The first conductive layer 1181 may include tin, and the second conductive layer 1182 may include indium, bismuth or other suitable materials, but not limited thereto. The first conductive layers 1181 and the second conductive layers 1182 include different materials. The alternatively stacked first conductive layers 1181 and second conductive layers 1182 may form an alloy or compound (such as the solder 112 in the first embodiment) through the thermal bonding or annealing. In some embodiments, the thicknesses of different first conductive layers 1181 may be the same or different, and the thicknesses of different second conductive layers 1182 may be the same or different. The percentage of each of the elements in the solder 1121 and the solder 1122 may be adjusted by adjusting the number and/or the thicknesses of the first conductive layers 1181 and the number and/or the thicknesses of the second conductive layers 1182, but not limited thereto. In some embodiments, a first conductive layer 1181 and a second conductive layer 1182 may be stacked to form the solder, but not limited thereto.

Figure 5A:
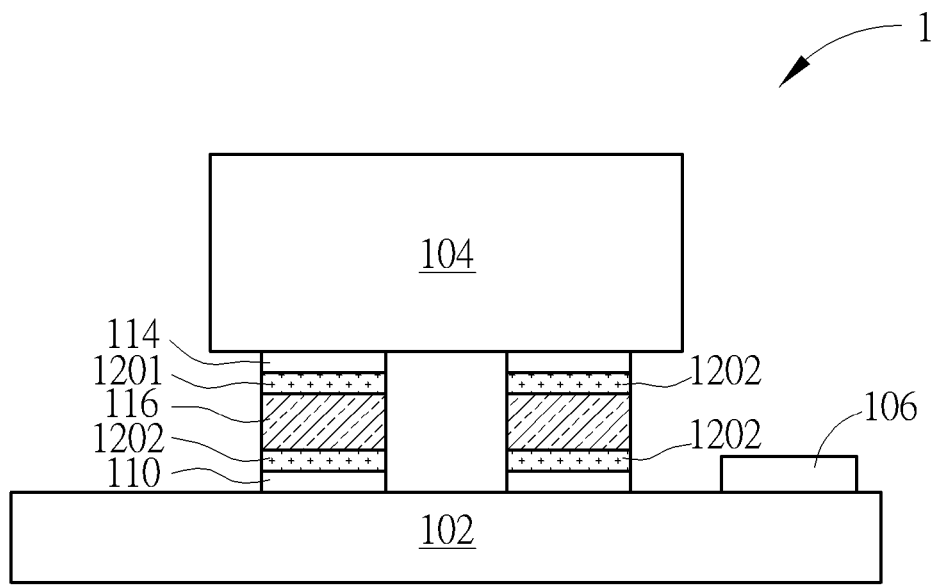
FIG. 5A schematically illustrates a side view of the electronic device after bonding according to the second embodiment of the present disclosure.

Referring to FIG. 5A, FIG. 5A schematically illustrates a side view of the electronic device after bonding according to the second embodiment of the present disclosure. Different from the first embodiment, at least a portion of the solder and at least a portion of the conductive structure (such as gold layer or the conductive layer including gold, but not limited thereto) may be mixed to form the solder alloy in some embodiments (as shown in FIG. 5A), that is, the solder alloy 116 may include gold, and the alloy having the atomic percentage of tin in the sum of tin and the metal element M in a range from 60% to 90% is defined as the solder alloy 116. In some embodiments, a portion of the solder which does not form the solder alloy 116 is a layer 1201, a portion of the conductive structure which does not form the solder alloy 116 is a first layer 1202 (such as gold layer or the layer including gold, but not limited thereto), and the thicknesses (and materials) of the layer 1201 and the thicknesses (and materials) the first layer 1202 may be the same or different, but not limited thereto. In some embodiments (shown in FIG. 5A), the layer 1201 and the first layer 1202 may be respectively located at two opposite sides of the solder alloy 116, which is shown in the left part of the stacked structure. In some embodiments (not shown), the first layer 1202 may be disposed between the solder alloy 116 and the substrate 102, and the layer 1201 may be disposed between the solder alloy 116 and the light emitting diode 104, but not limited thereto. In some embodiments, the positions of the layer 1201 and the first layer 1202 may be exchanged. In some embodiments (shown in FIG. 5A), the first layers 1202 (such as gold layers or the conductive layers including gold, but not limited thereto) may be located at two opposite sides of the solder alloy 116, which is shown in the right part of the stacked structure. For example, the first layer 1202 may be disposed between the solder alloy 116 and the substrate 102, another first layer 1202 may be dispose between the solder layer 116 and the light emitting diode 104, and the materials and thicknesses of these first layers 1202 may be the same or different. In some embodiment (not shown), the layers 1201 may be disposed at two opposite sides of the solder alloy 116. For example, one of the layers 1201 may be disposed between the solder alloy 116 and the substrate 102, the other one of the layers 1201 may be dispose between the solder layer 116 and the light emitting diode 104, and the materials and thicknesses of these layers 1201 may be the same or different. It should be noted that, the stacked structure in the left part and the stacked structure in the right part in FIG. 5A are only illustrative in order to clarify different stacked conditions, and the stacked structure in the left part is not limited to be different from the stacked structure in the right part. In some embodiments, the stacked structure in the left part and the stacked structure in the right part may be the same.

Figure 5B:
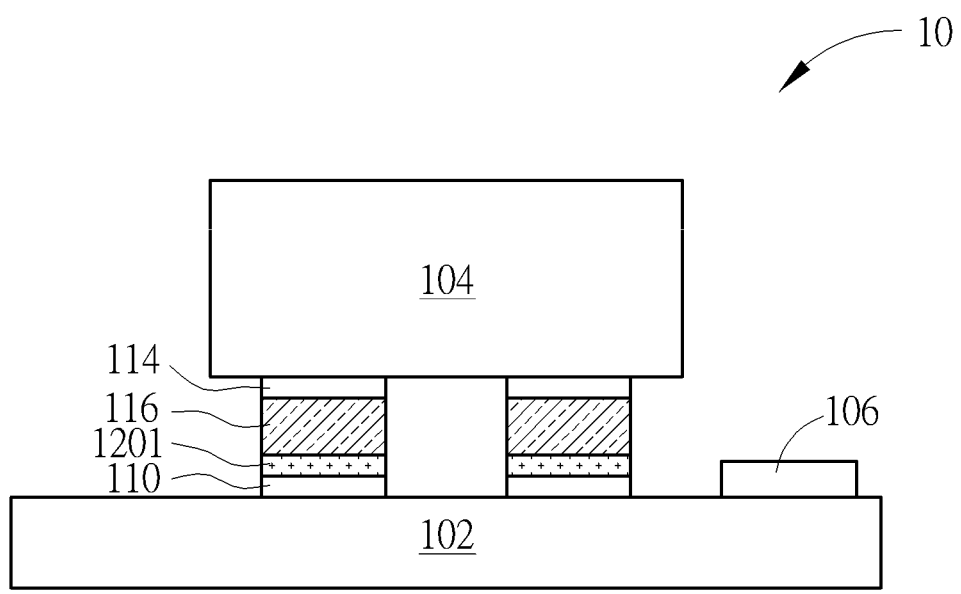
FIG. 5B schematically illustrates a side view of the electronic device after bonding according to the third embodiment of the present disclosure.

Referring to FIG. 5B, FIG. 5B schematically illustrates a side view of the electronic device after bonding according to the third embodiment of the present disclosure. Different from the first embodiment, the electronic device 10 may include layer 1201, but the electronic device 10 does not include first layers 1202 after bonding in some embodiments (as shown in FIG. 5B). For example, the electronic device 10 may include layer 1201, and the layer 1201 may be disposed between the solder alloy 116 and the substrate 102, or the layer 1201 may be disposed between the solder alloy 116 and the light emitting diode 104. In some embodiments (not shown), the electronic device may include the first layer 1202, but the electronic device does not include the layer 1201, and the first layer 1202 (such as gold layer or the layer including gold) may be disposed between the solder alloy 116 and the light emitting diode 104, or the first layer 1202 (such as gold layer or the layer including gold) may be disposed between the solder alloy 116 and the substrate 102. In some embodiments (not shown), the number of the layer 1201 may be greater than or equal to 1, the number of the first layer 1202 may be greater than or equal to 1, and/or the number of the solder alloy 116 may be greater than or equal to 1, but not limited thereto. The relative positions of the layer 1201, the first layer 1202, and the solder alloy 116 may be adjusted according to the bonding condition, and the present disclosure is not limited thereto.

Figure 6:
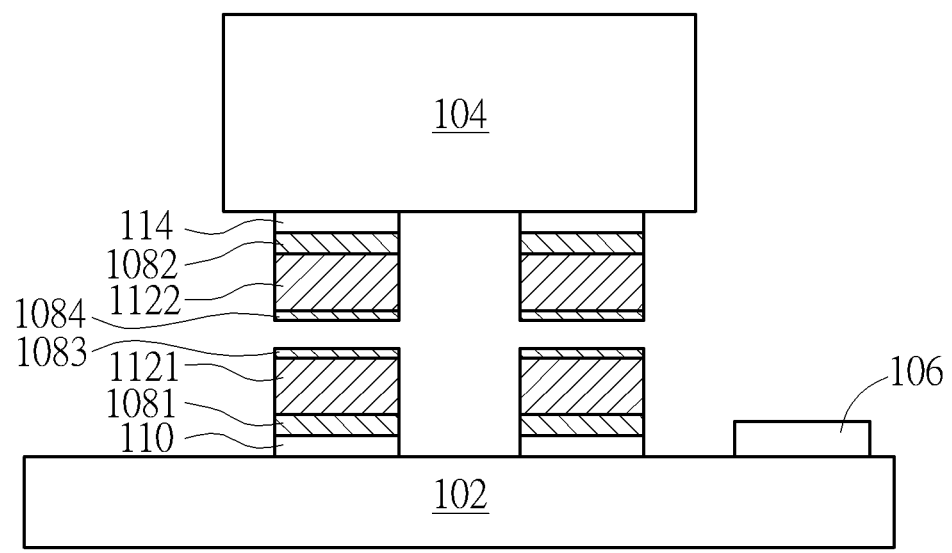
FIG. 6 schematically illustrates a side view of the electronic device before bonding according to the third embodiment of the present disclosure.

Referring to FIG. 6, FIG. 6 schematically illustrates a side view of the electronic device before bonding according to the third embodiment of the present disclosure. Different from the first embodiment, in some embodiments (as shown in FIG. 6) the bonding layer 114, the conductive structure 1082, the solder 1122, and the conductive structure 1084 may be formed or disposed on the light emitting diode 104 in sequence, and the bonding layer 110, the conductive structure 1081, the solder 1121 and the conductive structure 1083 may be formed or disposed on the substrate 102 in sequence, but not limited thereto. Other suitable layers (such as other conductive structures or other solders, but not limited thereto) may be intervened or added between the above-mentioned component or layers according to the demands, or the bonding layers or the metal layers may be removed according to the demands. In some embodiments (as shown in FIG. 6), the thicknesses of the conductive structure 1081, the conductive structure 1082, the conductive structure 1083, and/or the conductive structure 1084 may be less than or equal to the thicknesses of the solder 1121, the solder 1122, the bonding layer 110, and/or the bonding layer 114, but not limited thereto. In some embodiments, the thicknesses of the conductive structure 1081, the conductive structure 1082, the conductive structure 1083 and/or the conductive structure 1084 may be the same or different. In some embodiments, the materials of the conductive structure 1081, the conductive structure 1082, the conductive structure 1083, and/or the conductive structure 1084 may be the same or different.

According to the above-mentioned contents, in an embodiment of the present disclosure, the method of manufacturing an electronic device may include providing a substrate (such as the substrate 102), forming the solder (such as the solder 1121) on the substrate, and bonding the light emitting diode (such as the light emitting diode 104) to the substrate through the solder. The solder is formed by stacking a plurality of first conductive layers 1181 and a plurality of second conductive layers 1182 alternatively, and as mentioned above, the plurality of first conductive layers 1181 and the plurality of second conductive layers 1182 include different materials.

In another embodiment, the method of manufacturing an electronic device may include providing a light emitting diode (such as the light emitting diode 104), forming the solder (such as the solder 1122) on the light emitting diode, and bonding the substrate (such as the substrate 102) to the light emitting diode through the solder. The solder is formed by stacking a plurality of first conductive layers 1181 and a plurality of second conductive layers 1182 alternatively, and the first conductive layers 1181 and the second conductive layers 1182 include different materials.

Figure 7A:
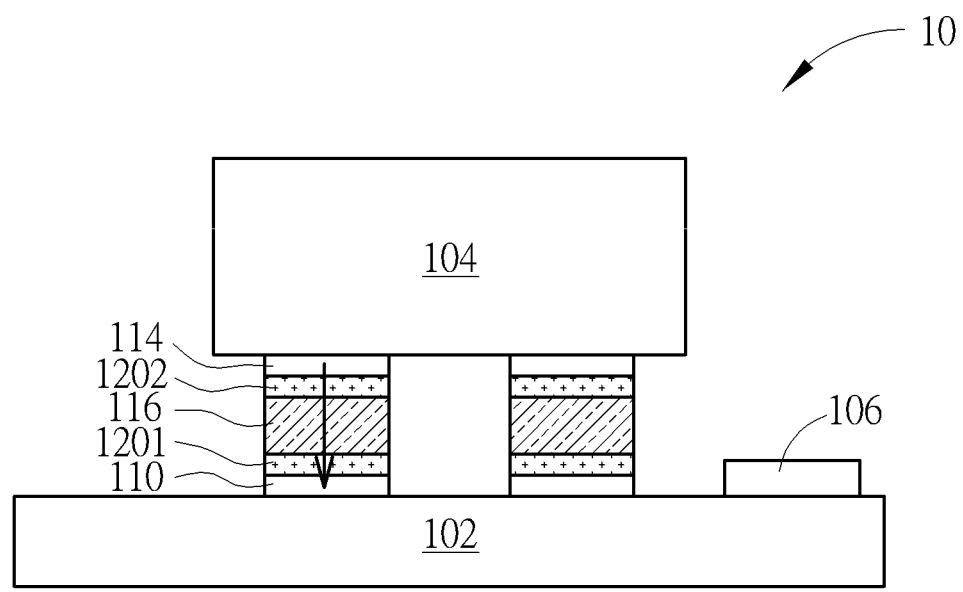
FIG. 7A schematically illustrates a side view of the electronic device measured by an energy dispersive spectrometer.
Figure 7B:
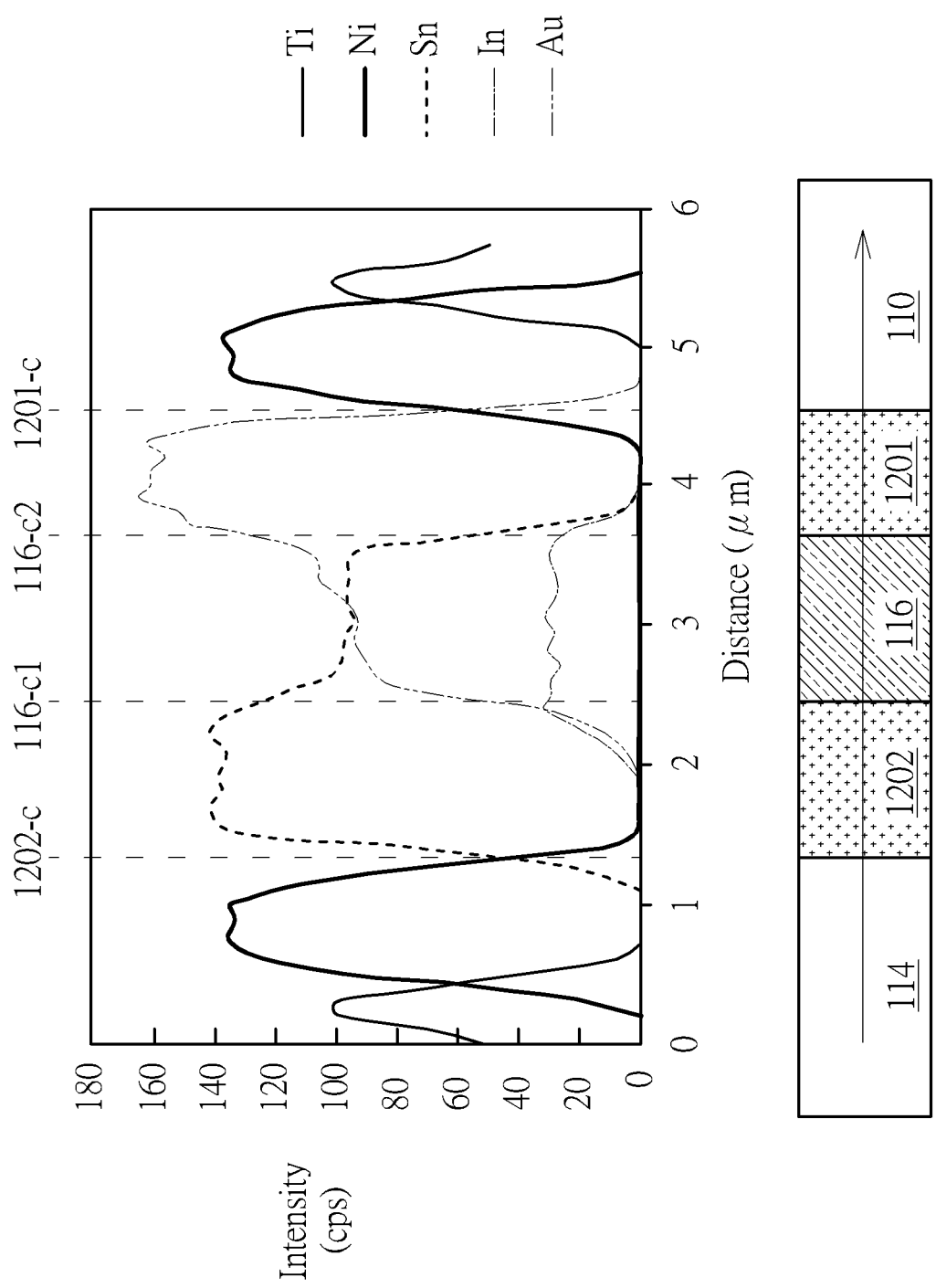
FIG. 7B schematically illustrates the analysis result of the solder alloy along the arrow shown in FIG. 7A.

Referring to FIG. 7A and FIG. 7B, FIG. 7A schematically illustrates a side view of the electronic device measured by an energy dispersive spectrometer, FIG. 7B schematically illustrates the analysis result of the solder alloy along the arrow shown in FIG. 7A. The measurement may be conducted along the direction of the arrow shown in FIG. 7A, but not limited thereto. The location and direction of the measurement may be adjusted according to the demands. FIG. 7B schematically illustrates a relation chart between the intensity (counts per second, cps) and the distance (μm) measured by EDS. In some embodiments (as shown in FIG. 7A), the measurement is performed from the layer (or component) nearest to the light emitting diode 104 (such as the bonding layer 114) to the layer (or component) nearest to the substrate 102 (such as the bonding layer 110). For example, the content or percentage of each of the elements in the bonding layer 114, the first layer 1202, the solder alloy 116, the layer 1201 and the bonding layer 110 are measured in sequence to obtain the relation chart between the intensity (counts per second, cps) and the distance (shown in FIG. 7B). The alloy having the atomic percentage of tin in the sum of tin and the metal element M (such as one of indium and bismuth) ranging from 60% to 90% is defined as the solder alloy 116. For example, the line 116-$c1$ and the line 116-$c2$ in FIG. 7B may be used to define the region of the solder alloy 116. In addition, although the present disclosure only illustrates one calculation method of the atomic percentage of tin in the sum of tin and metal element M, it is not limited thereto. For example (shown in FIG. 7B), the calculation is performed on the solder alloy 116 in which the distance is 3 micrometers (μm), the intensity (counts per second, cps) of tin in this position is about 95, the intensity (counts per second, cps) of indium in this position is about 30, and the result of the atomic percentage of tin in the sum of tin and indium may be obtained after substituting the values into the equation, which is 76%, such as ((Sn/(Sn+In)=95/(95+30)=0.76=76%). In some embodiments, the compartment line between different layers may be defined by the intersection of the curves of two different elements, but not limited thereto. For example, as shown in FIG. 7B, a line 1202-$c$ may be drawn through the intersection of the curves of two elements (such as nickel and tin), and a line 1201-$c$ may be drawn through the intersection of the curves of two elements (such as nickel and gold). The region between the line 1202-$c$ and the line 116-$c1$ may be the first layer 1202, the region between the line 1201-$c$ and the line 116-$c2$ may be the layer 1201, another part (the part different from the first layer 1202) using the line 1202-$c$ as the compartment line may represent the bonding layer 114, and another part (the part different from the layer 1201) using the line 1201-$c$ as the compartment line may represent the bonding layer 110, but not limited thereto. In some embodiments, the comparison may be performed according to the materials of the bonding layers, the conductive structures, and the solder combined with the result of analysis, and the regions of the solder alloy 116, the layer 1201, the first layer 1202, the bonding layer 110, and/or the bonding layer 114 may be defined by the above-mentioned method, but not limited thereto.

In some embodiments (referring to FIG. 7B), when the material of the bonding layer 114 includes titanium and nickel, and the material of the solder includes tin and indium, the line 1202-$c$ may be drawn through the intersection of the curves of nickel and tin, but not limited thereto. In some embodiments (referring to FIG. 7B), when the material of the bonding layer 110 includes titanium and nickel, and the material of the conductive structure includes gold, the line 1201-$c$ may be drawn through the intersection of the curves of nickel and gold, but not limited thereto.

It should be noted that the measuring method in the present disclosure is not limited to be performed along the direction of the arrow shown in FIG. 7A. In some embodiments (not shown), the measurement may be performed from the layers (or components) nearest to the substrate 102 to the layers (or components) nearest to the light emitting diode 104 (such as the bonding layer 114), or the measurement may be performed at any random position. It should be noted that, the corresponding distance of each of the layers shown in FIG. 7B is only illustrative. In some embodiments, the thickness of the bonding layer 110 or the bonding layer 114 may be greater than the thicknesses of the solder alloy 116, the layer 1201, and/or the first layer 1202. It should be noted that, FIG. 7B only illustrates one of the possible results, and the percentage of the elements in different layers may be different according to the number, thickness, material, or bonding temperature of the bonding layer, the metal layer, and the solder, but not limited thereto. Similarly, the percentage of the elements in each of the layers (not limited to before bonding or after bonding) according to the embodiments may be analyzed by the similar way.

In summary, the solder of the electronic device of the present disclosure may include alloy or compound which includes tin and indium (or tin and bismuth). The solder may be applied to the lower-temperature bonding process to reduce the possibility of damage of electronic components or increase hardness of the solder in order to reduce scratches because the melting point of the solder may be reduced, thereby improving the yields or reliability of the electronic device. In addition, the solder alloy may include tin and metal element M after bonding, the metal element M may be one of the indium and bismuth, and the atomic percentage of tin in the sum of tin and the metal element M ranges from 60% to 90% in the solder alloy.

Although the embodiments and the advantages thereof are described above, it should be noted that any one skilled in the art can change, replace and modify the features of the present disclosure without departing from the spirit of the present disclosure. In addition, the scope of the present disclosure is not limited to the processes, equipment, fabrication, composition, device, methods, and steps described in the specification, and any one skilled in the art can realize the processes, equipment, fabrication, composition, device, methods, and steps in the present or the future from the present disclosure. As long as it can implement approximately the same function or obtain approximately the same result in the embodiments of the present disclosure, it can be applied according to the present disclosure.

What is claimed is:

1. An electronic device, comprising:
   a substrate;
   a light emitting diode bonded to the substrate through a solder alloy;
   a first layer disposed between the solder alloy and the substrate; and
   a second layer disposed between the solder alloy and the light emitting diode,
   wherein the solder alloy includes tin, a metal element M and gold, the metal element M is one of the indium and bismuth, and the atomic percentage of tin in sum of the tin and the metal element M is in a range from 60% to 90% in the solder alloy,
   wherein the first layer and the second layer comprise gold, a content of gold in the first layer is greater than a content of gold in the solder alloy, and the content of gold in the solder alloy is greater than a content of gold in the second layer,
   wherein the first layer and the second layer comprise tin, a content of tin in the second layer is greater than a content of tin in the solder alloy, and the content of tin in the solder alloy is greater than a content of tin in the first layer.

2. The electronic device of claim 1, wherein the metal element M is indium.

3. The electronic device of claim 2, wherein the atomic percentage of tin in sum of the tin and indium is in a range from 60% to 85%.

4. The electronic device of claim 1, wherein the metal element M is bismuth.

5. The electronic device of claim 4, wherein the atomic percentage of tin in sum of the tin and bismuth is in a range from 60% to 80%.

6. The electronic device of claim 1, wherein the substrate is a thin film transistor substrate.

7. The electronic device of claim 1, further comprising a bonding layer disposed between the solder alloy and the substrate or between the solder alloy and the light emitting diode.

* * * * *